(12) United States Patent
Ma et al.

(10) Patent No.: US 9,054,018 B2
(45) Date of Patent: Jun. 9, 2015

(54) SEMICONDUCTOR DEVICE AND METHOD FOR MANUFACTURING THE SAME

(71) Applicants: Xiaolong Ma, Beijing (CN); Huaxiang Yin, Beijing (CN); Sen Xu, Beijing (CN); Huilong Zhu, Poughkeepsie, NY (US)

(72) Inventors: Xiaolong Ma, Beijing (CN); Huaxiang Yin, Beijing (CN); Sen Xu, Beijing (CN); Huilong Zhu, Poughkeepsie, NY (US)

(73) Assignee: The Institute of Microelectronics, Chinese Academy of Sciences, Beijing (CN)

( * ) Notice: Subject to any disclaimer, the term of this patent is extended or adjusted under 35 U.S.C. 154(b) by 104 days.

(21) Appl. No.: 13/812,503

(22) PCT Filed: Oct. 12, 2012

(86) PCT No.: PCT/CN2012/001378
§ 371 (c)(1),
(2) Date: Jan. 26, 2013

(87) PCT Pub. No.: WO2014/026307
PCT Pub. Date: Feb. 20, 2014

(65) Prior Publication Data
US 2014/0217362 A1    Aug. 7, 2014

(30) Foreign Application Priority Data
Aug. 16, 2012    (CN) .......................... 2012 1 0293347

(51) Int. Cl.
H01L 29/06    (2006.01)
H01L 21/84    (2006.01)
H01L 29/15    (2006.01)
(Continued)

(52) U.S. Cl.
CPC .......... *H01L 29/15* (2013.01); *H01L 29/66795* (2013.01); *H01L 29/785* (2013.01); *H01L 29/517* (2013.01); *H01L 29/7853* (2013.01); *H01L 29/1054* (2013.01);
(Continued)

(58) Field of Classification Search
CPC ............ H01L 29/66795; H01L 29/785; H01L 29/1033; H01L 29/1054
USPC .............................. 257/14, 192, 365; 438/156
See application file for complete search history.

(56) References Cited

U.S. PATENT DOCUMENTS

2009/0026543 A1*    1/2009    Yang .............................. 257/365
2009/0152596 A1*    6/2009    Yang et al. .................... 257/253
(Continued)

FOREIGN PATENT DOCUMENTS

| CN | 101432852 A | 5/2009 |
| CN | 102194756 A | 9/2011 |
| WO | 2011087570 A1 | 7/2011 |

*Primary Examiner* — Long K Tran
(74) *Attorney, Agent, or Firm* — Treasure IP Group, LLC

(57) ABSTRACT

The present invention discloses a method for manufacturing a semiconductor device, which comprises: forming a plurality of fins on a substrate, which extend along a first direction and have rhombus-like cross-sections; forming a gate stack structure on each fin, which traverses the plurality of fins and extends along a second direction; wherein a portion in each fin that is under the gate stack structure forms a channel region of the device, and portions in each fin that are at both sides of the gate stack structure along the first direction form source and drain regions. The semiconductor device and its manufacturing method according to the present invention use rhombus-like fins to improve the gate control capability to effectively suppress the short channel effect, moreover, an epitaxial quantum well is used therein to better limit the carriers, thus improving the device drive capability.

14 Claims, 4 Drawing Sheets

(51) Int. Cl.
*H01L 29/66* (2006.01)
*H01L 29/78* (2006.01)
*H01L 29/10* (2006.01)
*B82Y 10/00* (2011.01)
*H01L 29/51* (2006.01)
*H01L 29/165* (2006.01)

(52) U.S. Cl.
CPC ............ *H01L 29/151* (2013.01); *H01L 29/165* (2013.01); *B82Y 10/00* (2013.01)

(56) References Cited

U.S. PATENT DOCUMENTS

| | | | |
|---|---|---|---|
| 2012/0104472 A1* | 5/2012 | Xu et al. | 257/288 |
| 2013/0049068 A1* | 2/2013 | Lin et al. | 257/192 |
| 2013/0187228 A1* | 7/2013 | Xie et al. | 257/347 |
| 2014/0103435 A1* | 4/2014 | Basker et al. | 257/347 |

* cited by examiner

SEMICONDUCTOR DEVICE AND METHOD FOR MANUFACTURING THE SAME

CROSS REFERENCE

This application is a National Phase application of, and claims priority to, PCT Application No. PCT/CN2012/001378, filed on Oct. 12, 2012, entitled 'Semiconductor Device and Method for Manufacturing The Same', which claimed priority to Chinese Application No. CN 201210293347.0, filed on Aug. 16, 2012. Both the PCT Application and Chinese Application are incorporated herein by reference in their entireties.

FIELD OF THE INVENTION

The present invention relates to the field of manufacturing of semiconductor integrated circuit, in particular to a FinFET having a rhombus-like fin and a quantum well as well as the method for manufacturing the same.

BACKGROUND OF THE INVENTION

With the continuous reduction of semiconductor device size in scale, there is the problem that the threshold voltage falls with the reduction in the channel length, namely, a short channel effect occurs in the semiconductor device. In order to suppress such short channel effect, a new structure of Fin Field Effect Transistor (Fin FET) is used in the industry, that is, a plurality of parallel silicon Fins perpendicular to the SOI substrate are formed in a thin silicon layer at the top of the substrate, a channel region is formed at the middle of the silicon Fins, and source and drain regions are formed at the two ends of the silicon Fins, while a control gate is distributed across the plurality of silicon Fins.

However, due to the limitation of the etching process, the silicon Fins in the prior art have rectangular cross-sections, and accordingly, the control gate is conformal thereto, so the ratio of surface area to volume is small and the gate control capability is weak, and for a device whose channel is continuously reduced, the capability of suppressing the short channel effect is limited.

In addition, with the reduction in the device size, the problem concerning transportation of carriers becomes outstanding. Therefore finding ways to effectively limit the carriers and increase the carrier mobility becomes important for improving the device's drive capability.

SUMMARY OF THE INVENTION

In view of the above, an object of the present invention is to provide a FinFET having a rhombus-like fin and a quantum well as well as a method for manufacturing the same, which can overcome the above-mentioned defect, effectively suppress the short channel effect and increase the carrier mobility in the channel region of the device, thereby improving the overall performance of the device.

This object of the present invention is achieved by providing a semiconductor device, which comprises: a plurality of fins on a substrate, which extend along a first direction and which have rhombus-like cross-sections; a gate stack structure that traverses each fin and extends along a second direction; a channel region located under the gate stack structure in each fin; and source and drain regions located at both sides of the gate stack structure in each fin.

Wherein, a quantum well layer is disposed between the fins and the gate stack structure.

Wherein, the quantum well layer comprises a SiGe alloy.

Wherein, the gate stack structure comprises a gate insulating layer of a high-K material and a gate conductive layer of a metal material.

Wherein, there are raised source and drain regions at both sides of the gate stack structure on each fin.

Wherein, the substrate is SOI and the fins include Si.

The present invention also provides a method for manufacturing a semiconductor device, which comprises: forming a plurality of fins on a substrate, which extend along a first direction and have rhombus-like cross-sections; forming a gate stack structure on each fin which traverses the plurality of fins and extends along a second direction; wherein a portion in each fin that is under the gate stack structure forms a channel region of the device, and portions in each fin that are at both sides of the gate stack structure along the first direction form source and drain regions.

Wherein, the steps of forming a plurality of fins further comprises: forming a plurality of fins on the substrate, which extend along a first direction and have rectangular cross-sections; forming an epitaxial layer on each fin; etching the epitaxial layer and the fins to form fins having rhombus-like cross-sections.

Wherein, the fins are etched by KOH or TMAH wet etching.

Wherein, the width at the middle of the fin having a rhombus-like cross-section is greater than the width at the bottom thereof, and the top thereof is a sharp angle.

Wherein, after forming fins having rhombus-like cross-sections and before forming the gate stack structure, the method further comprises forming a quantum well layer on the fins.

Wherein, the quantum well layer comprises a SiGe alloy.

Wherein, the gate stack structure comprises a gate insulating layer of a high-K material and a gate conductive layer of a metal material.

Wherein, after forming the gate stack structure, the method further comprises forming gate spacers and raised source and drain regions at both sides of the gate stack structure.

Wherein, the substrate is SOI and the fins include Si.

Wherein, after forming the fins having rhombus-like cross-sections, the corners of the fins are further smoothed.

The semiconductor device and manufacturing method thereof according to the present invention use rhombus-like fins to improve the gate control capability to effectively suppress the short channel effect, moreover, an epitaxial quantum well is used therein to better limit the carriers, thus improving the device drive capability.

BRIEF DESCRIPTION OF THE DRAWINGS

The technical solution of the present invention will be described below in details with reference to the drawings.

DETAILED DESCRIPTION OF THE PREFERRED EMBODIMENTS

The features and technical effects of the technical solution of the present invention will be described in details below with reference to the drawings and in conjunction with the exemplary embodiments. It shall be noted that similar reference signs are used to denote similar structures, and the terms "first", "second", "on", "under", "thick", "thin" and the like can be used to modify various device structures, but such modifications do not imply the spatial, sequential or hierarchical relations of the modified device structure unless otherwise specified.

Figure 1:
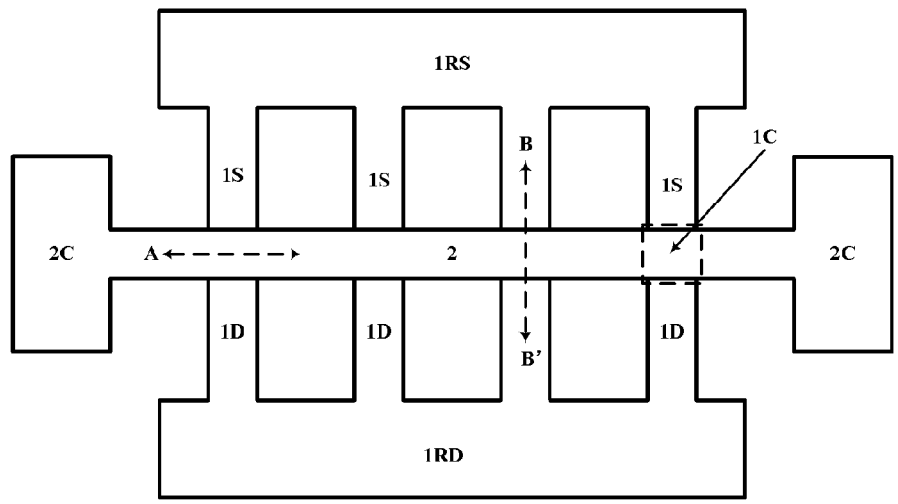
FIG. 1 is a top view of the semiconductor device according to the present invention.

First, FIG. 1 illustrates a top view of the semiconductor device according to the present invention.

As shown in FIG. 1, the semiconductor device comprises a plurality of fins 1 on an SOI substrate, which extend along a first direction parallel to the plane of the substrate and which are parallel to each other. The middle part of each of the plurality of fins form a channel region 1C (indicated by the block of the dashed lines) of the device, and the two ends of each of the plurality of fins form a source region 1S or drain region 1D of the device, and there are raised source regions (or source region contacts) 1RS and raised drain regions (or drain region contacts) 1RD at the two ends of the fins. A gate 2 intersects with the plurality of fins 1 and extends along a second direction parallel to the substrate plane, wherein the second direction is preferably perpendicular to the first direction. The gate 2 has gate connections 2C at the two ends beyond the plurality of fins 1 along the second direction. In the subsequent figures, a figure *.A represents a diagrammatic cross-section of the device taken from the line AA' of FIG. 1 along the second direction (only a single fin is shown), and a figure *.B represents a diagrammatic cross-section of the device taken from the line BB' of FIG. 1 along the first direction (the fin corresponding to FIG. 1 is shown), wherein * indicates 2-6.

Figure 2A:
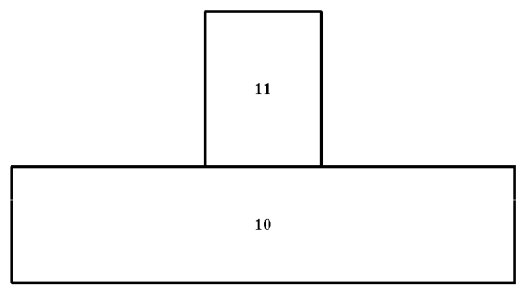
FIGS. 2-9 are sectional views corresponding to the steps of the semiconductor device manufacturing method according to the present invention.
Figure 2B:
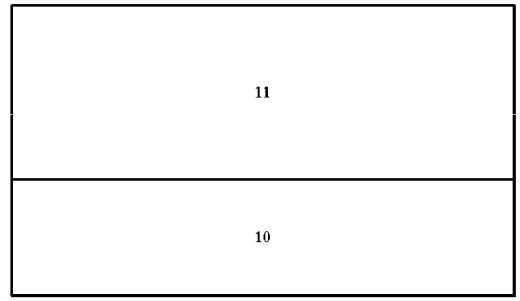

Referring to FIGS. 2A and 2B, a plurality of silicon fins are formed on a substrate 10. The substrate 10 is preferably a SOI wafer or a compound substrate having an oxide layer and a top thin Si thereon formed on the silicon wafer. Photolithography/etching are performed on the substrate 10 until the buried oxide layer of the SOI wafer or the intermediate oxide layer in the compound substrate is exposed, thus forming a plurality of fins 11 that are parallel to each other and that extend along a first direction. Wherein fins 11 usually have rectangular cross-sections and are distributed perpendicular to the substrate surface. The fins 11 are of the same material, i.e. Si, as the top semiconductor layer of the substrate 10. In addition, the fins 11 can be formed by other nanowire forming processes than etching. The fins 11 have a height of, for example, about 10-200 nm, a width of, for example, about 5-50 nm, along the second direction and a width of, for example, about 500-2000 nm, along the first direction.

Figure 3A:
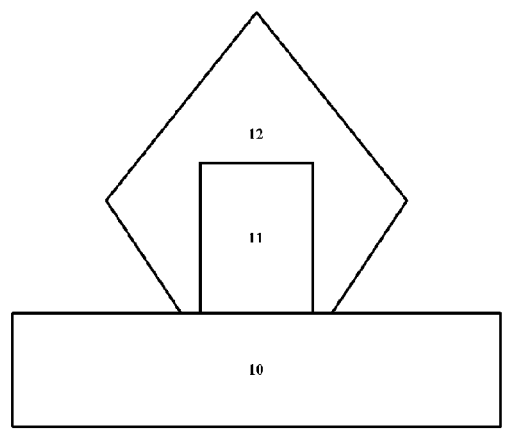
Figure 3B:
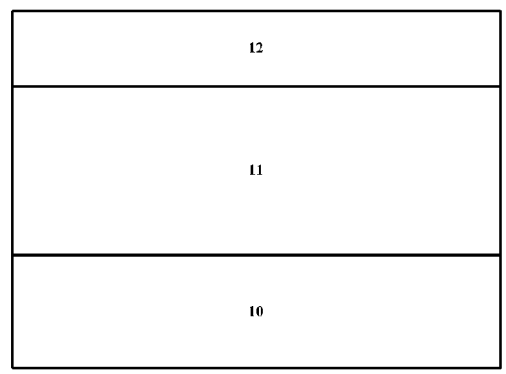

Referring to FIGS. 3A and 3B, an epitaxial layer 12 is formed on fins 11 (i.e. top and sidewalls thereof) through an epitaxial growth. The epitaxial layer 12 is of the same material as the fins 11, and they also extend along the first direction. Since the fins 11 are connected at the lower portions thereof to an insulating oxide surface of the substrate 10, the growth at the bottom is slow or there is substantially no growth at all during the epitaxial growth, but the growth at the top is faster. In addition, the growth on the (111) plane is slow. Therefore, the finally formed epitaxial layer 12 each usually has rhombus-like cross-section.

Figure 4A:
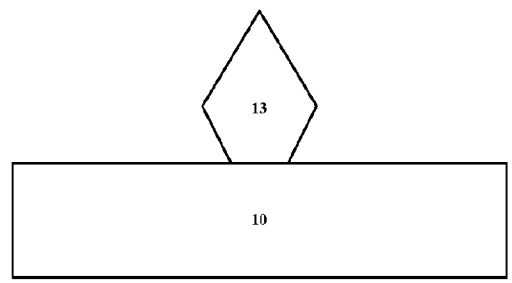
Figure 4B:
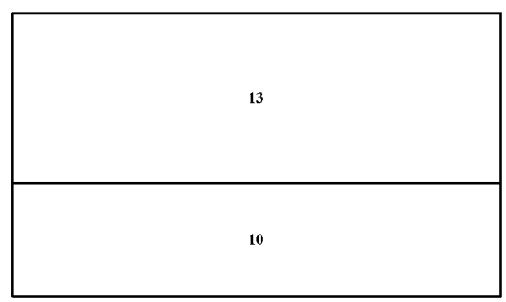

Referring to FIGS. 4A and 4B, the epitaxial layer 12 and the fins 11 are etched to form rhombus-like fins 13, which also extend along the first direction. With respect to the Si fins, such anisotropic etching liquids as KOH and TMAH can be used to etch the epitaxial layer 12 and the fins 11 sequentially. Since the etching rate to the (111) crystal plane is relatively slow, the etching will stop on the (111) crystal plane to form the rhombus-like fins 13 as shown in FIG. 4A. Wherein, the word "rhombus-like" mentioned above means a kind of polygon whose top width is close to the bottom width (the width herein referring to the width along the second direction), for example, the top width is smaller than or equal to the bottom width and preferably the vertex is a sharp angle, and whose middle width is greater than the bottom width and/or top width. In short, rhombus-like is a rhombus having a part of the bottom (or also a small part of the top) removed. The maximum widths, i.e. the middle widths, of the rhombus-like fins 13, are smaller than or equal to the widths of the rectangular fins 11 in the second direction, so the widths of the fin 13 are preferably, for example, 4-40 nm. Compared to the conventional rectangular fin 11, the rhombus-like fin 13 has an increased ratio of surface area to volume and can realize larger effective channel width in a unit plane area, meanwhile, it has better gate control capability and can effectively suppress the short channel effect. Preferably, after forming the rhombus-like fins 13, the corners (vertex angle, included angle between sides and base angle) are smoothed to improve the device reliability.

Figure 5A:
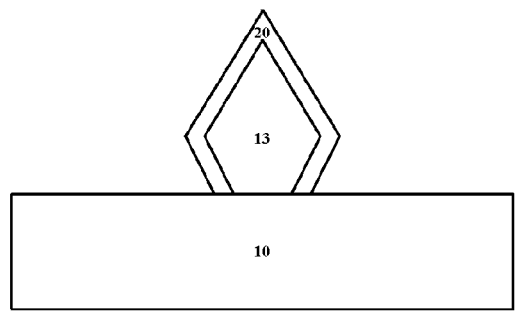
Figure 5B:
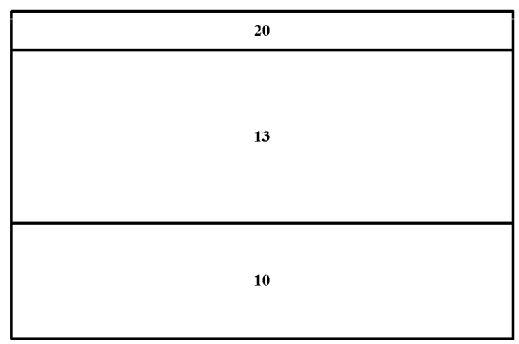

Referring to FIGS. 5A and 5B, a quantum well layer 20 is epitaxially grown on the rhombus-like fins 13, which also extends along the first direction to surround the rhombus-like fins 13. The process parameters like pressure, temperature and air feed rate of the epitaxial growth are controlled through such method as MBE, ALD and PECVD, so that the quantum well 20 uniformly surrounds each of the side faces of the rhombus-like fins 13, and conformally has a rhombus-like cross section accordingly. The quantum well 20 is of a material whose lattice constant is similar to that of Si, for example, a SiGe alloy, wherein the concentration (atomic number percentage) of Ge is within 40%-80%. The quantum well layer 20 can be a single layer of SiGe or a laminated structure of multiple layers having different concentrations of Ge. The quantum well layer 20 forms a semiconductor material having a wide band gap under the conductive channel by means of energy-band engineering, thus transportation of the carriers will be limited within the channel material of a narrow band gap to improve the carrier mobility, thereby to improve the device drive capability.

Figure 6A:
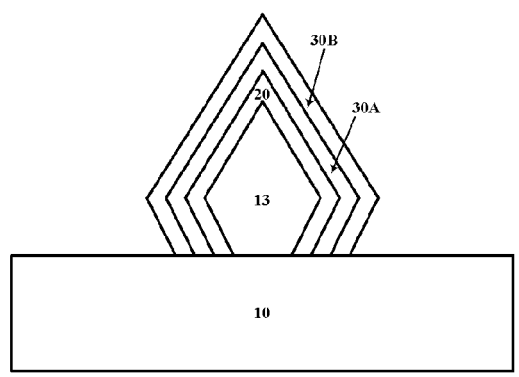
Figure 6B:
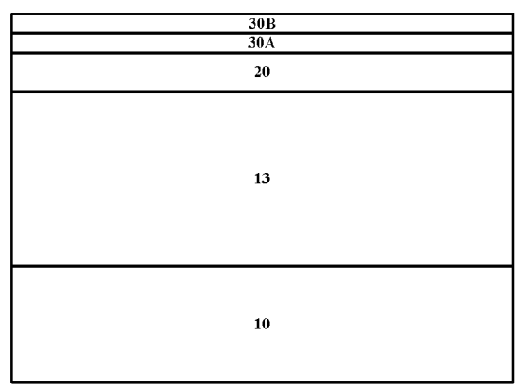

Referring to FIGS. 6A and 6B, a gate stack layer 30A/30B extending along the second direction is formed on the quantum well layer 20. The gate insulating layer 30A and gate conductive layer 30B are deposited sequentially on the quantum well layer 20 by means of such conventional deposition method as LPCVD, PECVD, HDPCVD, MOCVD, MBE, ALD, evaporation and sputtering. The gate insulating layer 30A is formed of a high-K material, which includes, but is not limited to, nitrides (e.g. SiN, MN, TiN), metal oxides (mainly oxides of sub-group or lanthanide metal elements, e.g. $Al_2O_3$, $Ta_2O_5$, $TiO_2$, $ZnO$, $ZrO_2$, $HfO_2$, $CeO_2$, $Y_2O_3$, $La_2O_3$), and perovskite phase oxides (e.g. $PbZr_xTi_{1-x}O_3$(PZT), $Ba_xSr_{1-x}TiO_3$ (BST)). The gate conductive layer 30B is formed of one of a metal and a metal nitride, or a combination thereof, wherein the metal includes Al, Ti, Cu, Mo, W and Ta, and the metal nitride includes TiN and TaN. The gate stack layer 30A/30B also extends along the first direction to surround the rhombus-like fins 13 and the quantum well layer 20. It shall be noted that the gate stack layer traverses the plurality of fins 13 in a manner as shown in FIG. 1, so it will extend along the second direction and direction AA'.

Figure 7:
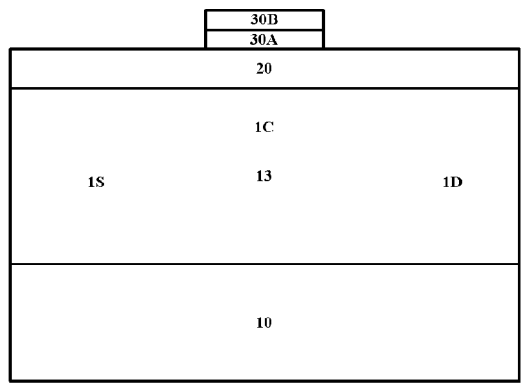
Figure 8:
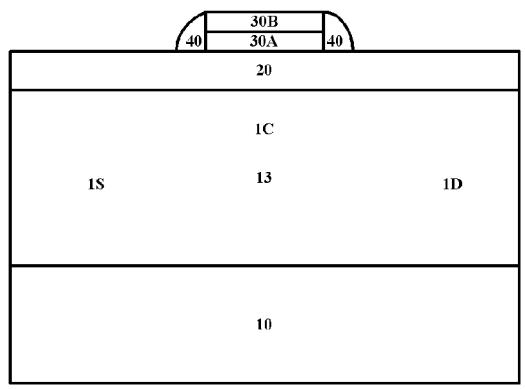
Figure 9:
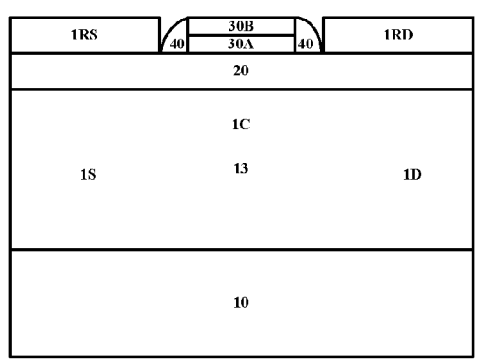

FIGS. 7-9 described below are sectional views along direction BB' in FIG. 1.

Referring to FIG. 7, wherein photolithography/etching are performed on the gate stack layer along the first direction until exposing the quantum well layer 20 to form the gate stack structure. As shown in FIG. 7, the quantum well layer 20 and part of the fins 13 under the gate stack structure 30A/30B form a channel region 1C of the device, and the two ends thereof (along the first direction) form the source region 1S and drain region 1D of the device, respectively.

Referring to FIG. 8, gate spacers 40 are formed on the quantum well layer 20 at both sides of the gate stack structure (along the first direction). For example, the spacers formed of one of silicon nitride, silicon oxynitride and Diamond like Carbon (DLC) are formed by depositing using methods like PECVD, HDPCVD, sputtering, etc. and then etching.

Finally, referring to FIG. 9, the raised source region 1RS and raised drain region 1 RD are formed on the quantum well layer 20 at both sides of the gate spacers 40 (along the first direction) by means of, for example, such epitaxial techniques as MBE and CVD.

The semiconductor device and method for manufacturing the Same according to the present invention use rhombus-like fins to improve the gate control capability to effectively suppress the short channel effect, moreover, an epitaxial quantum well is used therein to better limit the carriers, thus improving the device's drive capability.

While the invention has been described in conjunction with one or more exemplary embodiments, those skilled in the art are aware that various appropriate changes and equivalents can be made to the method for manufacturing the device structure without departing from the scope of the present invention. In addition, on the basis of the disclosed teaching, many modifications that may be adapted to specific situations or materials can be made without departing from the scope of the present invention. Therefore, it is not intended to limit the present invention to the specific embodiments that are disclosed as the best ways of implementing the present invention, and the disclosed device structure and its manufacturing method shall include all embodiments that fall within the scope of the present invention.

What is claimed is:

1. A semiconductor device, comprising:
   a plurality of fins on a substrate, which extend along a first direction and have rhombus-like cross-sections, and wherein each fin is consisting of one semiconductor material;
   a gate stack structure that traverses each fin and extends along a second direction;
   a channel region located under the gate stack structure in each fin; and
   source and drain regions located at both sides of the gate stack structure in each fin;
   a quantum well layer is disposed between the fins and the gate stack structure; and
   wherein, the quantum well layer comprises a SiGe alloy.

2. The semiconductor device according to claim 1, wherein, the gate stack structure comprises a gate insulating layer of a high-K material and a gate conductive layer of a metal material.

3. The semiconductor device according to claim 1, wherein, there are raised source and drain regions at both sides of the gate stack structure on each fin.

4. The semiconductor device according to claim 1, wherein, the substrate is SOI and the fins include Si.

5. A method for manufacturing a semiconductor device, comprising:

forming a plurality of fins on a substrate, which extend along a first direction and have rhombus-like cross-sections sections, and wherein each cross-section is consisting of one semiconductor material;
   forming a gate stack structure on each fin, which traverses the plurality of fins and extends along a second direction;
   wherein a portion in each fin that is under the gate stack structure forms a channel region of the device, and portions in each fin that are at both sides of the gate stack structure along the first direction form source and drain regions;
   wherein the step of forming a plurality of fins further comprises:
   forming a plurality of fins on the substrate, which extend along a first direction and have rectangular cross-sections;
   forming an epitaxial layer on each fin; and
   etching the epitaxial layer and the fins to form fins having rhombus-like cross-sections.

6. The method for manufacturing a semiconductor device according to claim 5, wherein, the fins are etched by KOH or TMAH wet etching.

7. The method for manufacturing a semiconductor device according to claim 5, wherein, the width at the middle of the fin having a rhombus-like cross-section is greater than the width at the bottom thereof, and the top thereof is a sharp angle.

8. The method for manufacturing a semiconductor device according to claim 5, wherein, after forming fins having rhombus-like cross-sections and before forming the gate stack structure, the method further comprises forming a quantum well layer on the fins.

9. The method for manufacturing a semiconductor device according to claim 8, wherein, the quantum well layer comprises a SiGe alloy.

10. The method for manufacturing a semiconductor device according to claim 5, wherein, the gate stack structure comprises a gate insulating layer of a high-K material and a gate conductive layer of a metal material.

11. The method for manufacturing a semiconductor device according to claim 5, wherein, after forming the gate stack structure, the method further comprises forming gate spacers and raised source and drain regions at both sides of the gate stack structure.

12. The method for manufacturing a semiconductor device according to claim 5, wherein, the substrate is SOI and the fins include Si.

13. The method for manufacturing a semiconductor device according to claim 5, wherein, after forming the fins having rhombus-like cross-sections, the corners of the fins are further smoothed by an isotropic wet or dry etching method.

14. The method for manufacturing a semiconductor device according to claim 5, wherein, the width at the middle of the fin having a rhombus-like cross-section is greater than the width at the bottom thereof, and the top thereof is a sharp angle.

* * * * *